United States Patent [19]

Sakaguchi

[11] Patent Number: 4,796,100

[45] Date of Patent: Jan. 3, 1989

[54] PICTORIAL INFORMATION SOURCE SYSTEM

[75] Inventor: Shozaburo Sakaguchi, Saitama, Japan

[73] Assignee: Pioneer Electronic Corporation, Tokyo, Japan

[21] Appl. No.: 834,683

[22] Filed: Feb. 28, 1986

[30] Foreign Application Priority Data

Feb. 28, 1985 [JP] Japan ................................ 60-39453
Feb. 28, 1985 [JP] Japan ................................ 60-39454

[51] Int. Cl.$^4$ .............................................. H04N 5/76
[52] U.S. Cl. ........................................ 358/342; 369/48; 369/197
[58] Field of Search ................ 358/342; 365/244; 369/47, 48, 69, 292, 197; 360/98

[56] References Cited

U.S. PATENT DOCUMENTS 4,433,347  2/1984  Sugiyama et al. .............. 358/342
4,660,100  4/1987  Sugiyama et al. .............. 358/342

Primary Examiner—L. T. Hix
Assistant Examiner—David M. Gray
Attorney, Agent, or Firm—Sughrue, Mion, Zinn, Macpeak, and Seas

[57] ABSTRACT

An integrated audio and pictorial display system, especially for use in cars, in which two compact disc players contain a disc with audio recordings and a disc with pictorial information. The audio disc is demodulated and applied to an audio output. The video disc is applied to a video display in digital form. Whether one player contains a video or audio disc may be determined by special signals recorded thereon.

7 Claims, 4 Drawing Sheets

PICTORIAL INFORMATION SOURCE SYSTEM

BACKGROUND OF THE INVENTION

The present invention relates to a system that provides pictorial information on board of a vehicle.

A recently developed on-board pictorial source system, used as a navigation (NAVI) system for a vehicle, provides pictorial information such as road map information or the like for vehicle riders to order to facilitate vehicle driving. This system has seen practical use. When this navigation system is used, the road map information is displayed on a screen of a display device which is located within or at least in the vicinity of a instrument panel in front of the vehicle driver. Therefore, this system is very convenient for the vehicle driver because he can with ease successively confirm the destination, the current position, and so on, even while he is driving the car.

By using the navigation system, it is possible to provide not only the road map information but pictorial information such as operational data for the vehicle, a maintenance guide, various kinds of warning and the like. Further, it is possible to provide pictorial information such as explaining a procedure. Such a procedure would be a repair procedure for a break-down condition in the case where the break-down condition has been displayed by the maintenance guide. Furthermore, in the case where map information is displayed on the screen, it is possible to selectively display information showing locations of gasoline service stations, restaurants, hotels, etc., in addition to the map information which is mainly composed of roadway information.

It is, however, necessary to store data for the information in a memory to make it possible to provide such various kinds of pictorial information, as described above. If a conventional and generally known semiconductor memory is employed as the memory for this pictorial information, a large number of memories are required because the amount of data to be stored is very large. As a result, the system is increased in size and its cost is high.

Recently, on the other hand, an on-board audio player has been developed and manufactured which can play a digital audio disc, that is, the so-called compact disc (CD). The playback is performed with high-fidelity even within a car where the playback conditions are poor. This CD can be utilized not only as an audio disc but as a ROM (read only memory) to store data for video pictorial information or the like. A CD used for such data will be called a CD-ROM. If it is possible to use this CD-ROM as a memory in an on-board pictorial information display system, it is believed that the use of such a CD-ROM would be very advantageous in view of the reduction in size as well as in cost of the system because such a CD-ROM has an extremely large storage capacity as well as a short access time.

In the case where a CD-ROM is used as a memory in an onboard pictorial information source, it is desirable to have such a system in which a CD used for music (its original purpose) as well as a CD used for a ROM can both be satisfactorily and compatibly used.

SUMMARY OF THE INVENTION

Accordingly, an object of the present invention is to use a compact disc for video information.

Another object of the invention is to provide an on-board information source in which it is possible to use a CD for music as well as a CD for ROM that are compatible with each other.

The present invention can be summarized as an on-board pictorial source system that provides pictorial information for vehicle riders. A first disc playback unit reproduces digital data recorded on recorded disc. A output section produces pictorial information and outputs it on the basis of the reproduced digital data produced from the first disc playback unit. A second disc playback unit reproduces a digital audio signal recorded on another recorded disc. The second playback unit produces the reproduced digital audio signal in the form of a signal converter from digital to analog. The first and second disc playback units are capable of operating independently of each other.

In another embodiment of the present invention, the on-board pictorial information source system operates as follows. A single disc playback unit reproduces digital data recorded on a disc. Pictorial information is produced on the basis of the reproduced digital data. A selector selectively produces the reproduced digital data supplied from the disc reproducing means. A demodulator demodulates the so-selected digital data into an analog signal. A controller controls the selector in accordance with the recorded contents in a disc recording medium loaded in the disc playback unit.

DESCRIPTION OF THE PREFERRED EMBODIMENTS

Figure 1:
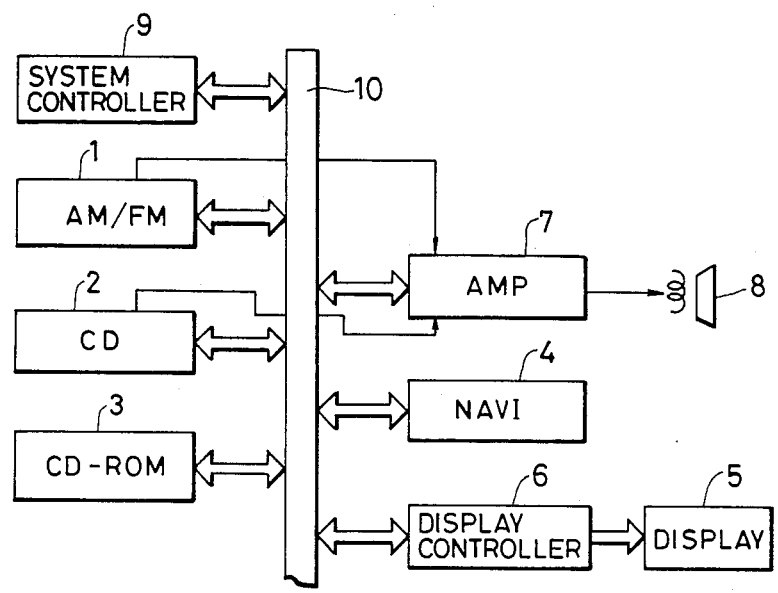
FIG. 1 is a block diagram of a preferred embodiment of pictorial information source system of the invention.

Referring to the drawings, two embodiments of the present invention will be described.

FIG. 1 is a block diagram showing a first embodiment according to the present invention. There are four sources, an AM/FM tuner 1, a CD player 2 for music, a CD player 3 for a CD-ROM (i.e., for pictorial information) and a navigation system 4, each of which output some type of information. Of these four sources, the navigation system 4 functions as a source for providing pictorial information for vehicle riders. The CD player 3 for CD-ROM is used in cooperation with the navigation system 4 to act as a dedicated player for playing back a CD-ROM in which pictorial information and the like are stored. A display device 5 displays the pictorial information. It is physically located, for example, within or in the vicinity of an instrument panel in front of the vehicle driver and is controlled by a display controller 6. An audio amplifier 7 selectively amplifies analog audio signals applied to it from the AM/FM tuner 1 and from the CD player 2, and then drives a speaker 8 with the audio signal.

The AM/FM tuner 1, the CD music player 2, the CD-ROM player 3, the navigation system 4, the display controller 6, and the audio amplifier 7 are all controlled by a system controller 9 when an "ON" key is operated. These units are connected with each other through a digital bus 10 so that they are arranged to operate together as a system. That is, they are employed in a general controlled mode through a common bus.

Figure 3:
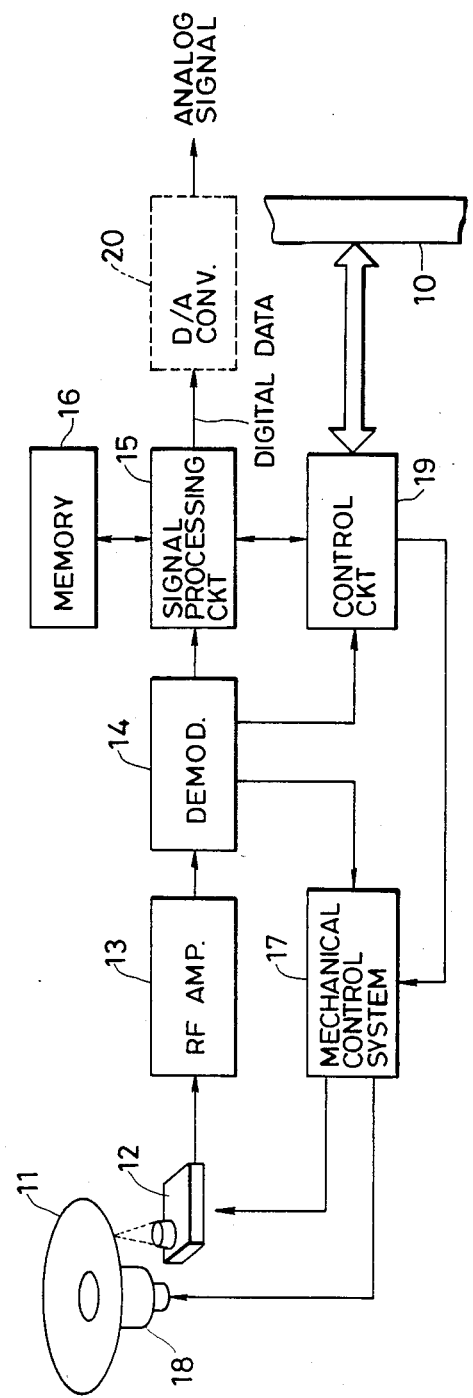
FIG. 3 shows the overall arrangement of a CD player.

FIG. 3 shows an embodiment of the arrangement of the CD player, whether it is the CD music player 2 or the CD-ROM player 3. Information recorded on a disc 11 is read, for example, by an optical pickup 12. The read-out signal is amplified by a high-frequency amplifying circuit 13 and then demodulated by a demodulating circuit 14. The demodulated output of the demodulating circuit 14 is subjected to signal processing such as, for example, deinterleaving or error correction, by means a signal processing circuit 15. The processed signal is thus produced as digital data. In this signal processing, a memory 16 is used for temporarily storing demodulated data required for the processing operation.

A mechanical control system 17 controls a focus servo system and a tracking servo system of the pickup 12 as well as a spindle motor 18 for rotationally driving the disc 11 in response to the demodulated output from the demodulating circuit 14. A control circuit 19 controls the signal processing circuit 15 and the mechanical control system 17 and is connected to the system bus 10 so as to be controlled by the system controller 9 of FIG. 1.

In the CD music player 2, an additional element, a D/A (digital-to-analog) converting circuit 20, is further provided as a succeeding stage and is connected to an output of the signal processing circuit 15 so that the output of the signal processing circuit 15, which has been demodulated into digital data, is demodulated (converted) into an analog audio signal by the D/A converting circuit 20 and then applied to the audio amplifier 7 of FIG. 1. In the CD-ROM player 3, on the contrary, the output of the signal processing circuit 15 is used in an unchanged digital state for various purposes as containing the digital data in the ROM.

Furthermore, both the CD music player 2 and the CD-ROM player 3 are arranged such that the loading and ejection of a disc can be completely effected automatically.

Next, the operation of this system will be described. In this system, the system controller 9 receives data entered by means of an operation key from an operating panel (not shown) so as to control the whole system through the digital bus 10. The AM/FM tuner 1, the CD music player 2, and the audio amplifier 7 constitute an audio system which performs the same operations as in an ordinary audio system under the control of the system controller 9.

The CD-ROM player 3 reproduces data for the pictorial information, and the like recorded or stored on the CD-ROM. A reproduced output of the CD-ROM player 3 is used as data for various operations. For example, the data is used for displaying road map information or different procedures for a car on a screen of the display device 5. For such displays, the CD-ROM player 3 is operated in cooperation with the navigation system 4.

In driving a vehicle by using the navigation system 4, it is preferable to always display road map information on the screen of the display device 5. However, in the case where it is desired to simultaneously listen to music, it is necessary to operate simultaneously and in parallel the CD music player 2 for music and the CD-ROM player 3. In this system, the CD players 2 and 3 individually play the music CD and the CD-ROM. That is, there are two separate CD players 2 and 3. In this embodiment, the demodulating circuit (the A/D converting circuit 20) for converting digital data into an analog signal is built into the CD music player 2. Therefore it is possible to operate both the CD players independently of each other and thus it is possible to simultaneously listen to music by playing the music CD even during the use of the CD-ROM player 3.

However, the CD music player 2 has the same mechanical arrangement as that of the CD-ROM player 3. Therefore when both the CD players 2 and 3 are disposed, for example, one on top of the other, there exists the possibility that a disc that has recorded thereon one type of signal is erroneously loaded into one of the players for which it is not matched. In such a situation, a disc placed in the wrong player makes it impossible to perform the original purpose of the system.

In order to prevent the occurrence of such inconvenience as described above, the system can be arranged such that when a disc is erroneously loaded into the wrong player, the error is detected so that the erroneously placed disc is automatically ejected.

Figure 4:
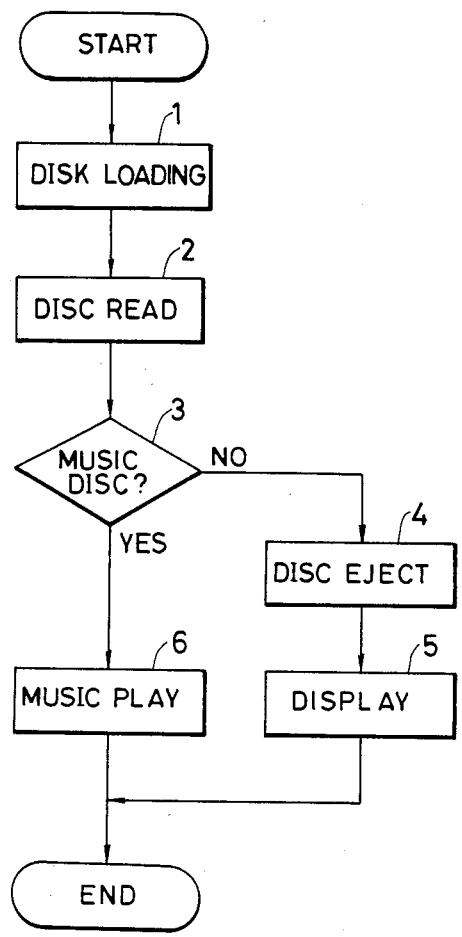
FIGS. 4, 5 and 6 and flowcharts used to explain the operation of the invention.

The operation at that time will be described with reference to the flowcharts of FIGS. 4 and 5. FIG. 4 is a flowchart for the use of the CD music player 2. First, when a disc is loaded, (step 1), the CD music player 2 begins to play or reproduce the disc once (step 2). At this time, an output of the signal processing circuit 15 is input into the control circuit 19 to check user's bits in a subsidiary code in a Q channel so as to judge whether or not the unloaded disc is a music CD or another type (step 3). The subsidiary code is composed of 8 bits×98 frames per block, and is classified into P, Q, R, . . ., W channels in which the P and Q channels are referred to as the user's bits. In this embodiment, the Q channel is used for discriminating the type of disc. If the disc is not a music disc, the control circuit 19 performs the necessary control to eject the disc and the display controller 6 is caused to display on the screen of the display device 5 information indicating that a disc of the wrong type has been loaded in order to alert the operator of this fact (step 5). In step 3, if the check determines that the loaded disc is a normal audio disc, the operation moves to step 6 and the music CD played in normal audio operation.

Figure 5:
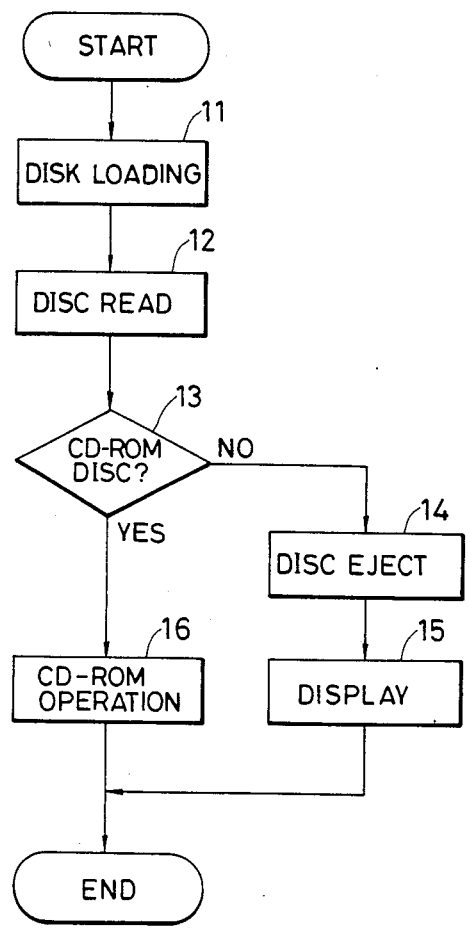

FIG. 5 is a flowchart for the use of the CD-ROM player 3. The operation proceeds in this case quite similarly to the case of the CD music player 2. However, the check of disc type is made by checking the user's bits in the Q channel to determine if this is a CD-ROM disc.

Although it is not always required to prvoide a warning as to erroneous disc loading, it is preferable to provide such a warning in the case where a driver operates the system. For this purpose, each of the CD players may be provided with a display device for informing the operator by an audio alarm of an erroneous disc loading instead of simply displaying such an alarm on the screen of the display device 5. Further the arrangement may be modified such that the audio alarm is produced either in place of or together with the video alarm indication. In the case where a non-driving passenger operates the system, the arrangement may be modified so as to make it possible to select either the video or the audio warning when the situation requires because there are some cases where the warning display or the warning sound is troublesome for the driver.

Although the use of the CD-ROM has been described above with respect to the use and display of map data, car handling procedures and such, which are displayed on the screen of the display device 5 as a fixed display, the invention is not limited to the described embodiments.

Moreover, although the general-control mode is used in the system as shown in FIG. 1, the control for each unit is not limited to this approach. It is sufficient as long as the individual units are caused to perform a unified system operation. In the general-control mode and through the use of a common bus line, however, it is possible to interrupt the reading operation, even while the data is being read from the CD-ROM, so as to transfer a command to the CD music player to change the operation mode. Therefore, it is possible to cause a number of players to perform parallel operations.

Further, when it is required to increase the number of CD-ROMs to extend the system, it is possible to use two or more CD-ROM players with the same bus oriented system.

As described above, according to the embodiment of the onboard pictorial information source system, the CD music player for music and the CD-ROM player are so arranged that they can be operated independently of each other, so as to make it possible to listen to music by playing a music CD even during the use of a CD-ROM.

Since the CD players are controlled by one and the same system controller, it is unnecessary to change over the operating system even when a plurality of CD players are used, and therefore it is not required that each of the CD players have an individual operating system. This, of course, results in a desirable reduction in the amount of required space.

Figure 2:
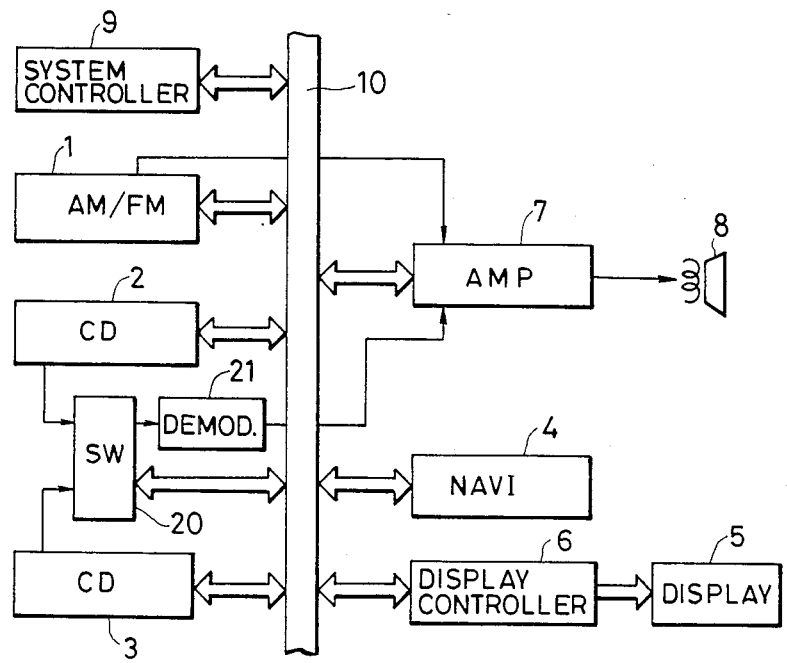
FIG. 2 is a block diagram showing a second embodiment according to the present invention.

FIG. 2 is a block diagram showing a second embodiment according to the present invention. In FIG. 2, elements corresponding to those in FIG. 1 are labeled similarly. Either one of respective digital data outputs from two CD players 2 and 3 is selected by a selecting switch circuit 20 and converted into an analog signal by an analog demodulating circuit 21 in the form of a D/A (digital-to-analog) converting circuit. An audio amplifier 7 selectively amplifies analog audio signals produced by an AM/FM tuner 1 and or by the analog-demodulating circuit 21 and then drives a speaker 8.

Figure 6:
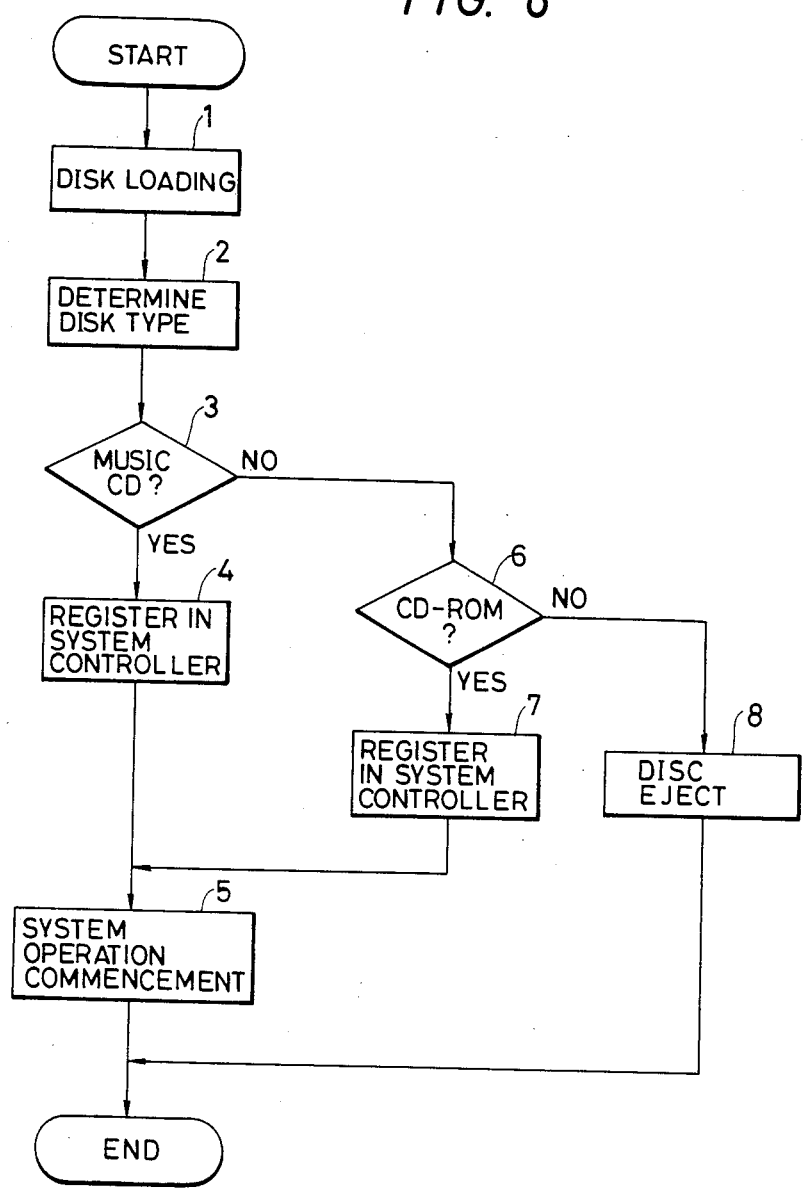

The operation of the system of FIG. 2 will be described with reference to a flowchart of FIG. 6. In this system, a system controller 9 receives data entered by means of an operating key in an operating panel (not shown) so as to control the whole system through a bus 10.

First, when a disc is loaded into the CD player 2 or 3 (step 1), the loaded CD player begins to read the disc and the subsidiary code is identified to determine the type of recorded contents in the loaded disc (step 2). That is, it is possible to determine the type of contents recorded on the disc by checking user's bits in a subsidiary code recorded in a Q channel on the disc.

Next, a determination is made as to whether the recorded contents are music or not (step 3). If the contents are music, the player registers the fact that the loaded disc is a music CD into the system controller 9 through the bus 10 (step 4). Since the output of the CD player is in the form of digital data, when a music CD is being played the system controller 9 issues a change over control signal to the selecting switch circuit 20 through the bus 10 so as to cause the selecting switch circuit 20 to select the output of that player with a music CD. That is, control operation in step 5 changes over the selecting switch circuit 20 so that the digital data produced from the CD player is applied through the selecting switch circuit 20 to the analog-demodulating circuit 21 to be converted into an analog signal which is in turn applied to the audio amplifier 7.

In step 3, if the result of the test proves that the recorded contents are not music, the operation is shifted to step 6 and another test is made as to whether the recorded contents are ROM data or not. If the test proves that the recorded contents are ROM data, the CD player registers the fact that the loaded disc is CD-ROM into the system controller 9 through the bus 10 (step 7). In playing back a CD-ROM, it is unnecessary to convert an output of the player into an analog signal, and therefore in step 5, the system controller 9 performs such control that the digital data output of the player is transferred as it is to other units through the bus 10. In step 6, if the result of the test 3 proves that the recorded contents are not ROM data, the disc cannot be used in a normal music mode because, for example, the disc is loaded in the wrong player, and therefore the disc is ejected (step 8).

In playing a CD-ROM, pictorial information data, etc., recorded (stored) in the CD-ROM are used for various operations. For example, the data are used for various purposes, for example, for displaying road map information or car handling procedures, on a screen of the displaying device 5 when the CD player 3 is operated in cooperation with the navigation system 4.

In driving a vehicle by using the navigation system 4, it is preferable to always display road map information on the screen of the displaying device 5. In the case where it is desired to simultaneously listen to music, it is possible to load a CD-ROM and music CD into respective players to cause the players to operate in parallel so as to provide music from the music CD even during the use of the CD-ROM.

Further, the two CD players 2 and 3 and the selecting switch circuit 21 are controlled by the system controller 9, so that it is possible to use both the players for playing a music CD and therefore it is possible to have continuous playing of music by using the two CD players. Similarly to this, both the two players can be used for playing a CD-ROM, and therefore it is possible to further increase the data storage capacity, so that the CD players can be applied to various data processing operations.

Although the use of the CD-ROM has been described by way of example above with respect to the use of map data and car handling data, which are displayed on the screen of the display device 5 as a still picture, the use is not limited to those cases.

Although the selecting switch circuit 21 is directly controlled by the system controller 9 through the bus 10 in the foregoing embodiment, the arrangement may be modified such that the selecting switch circuit 21 is controlled by the respective CD players.

Further, the system control through the bus is not limited to such a manner as described in the embodiments. Furthermore, the number of the CD players to be used is not limited to two but the present system can be made to operate with three or more CD players.

As described above, in the on-board picture information source system according to the present invention, the arrangement is made such that a plurality of CD players produce respective outputs in the form of digital data and the data are then selectively applied to an analog demodulating circuit in accordance with the recorded contents in the disc. Therefore it is unnecessary to select the players when a disc is loaded and there occurs no inconvenience of erroneous disc loading so that the handling is made facilitated. Further, although a plurality of CD players are employed, one and the same analog demodulating circuit can be commonly used, resulting in decreased cost.

What is claimed is:

1. An on-board pictorial information source system for providing pictorial information for vehicle riders comprising:

first disc reproducing means for reproducing a disc recording medium carrying digital data recorded therein;

output means for producing pictorial information on the basis of the reproduced digital data produced from said first disc reproducing means;

second disc reproducing means for reproducing another disc recording medium carrying digital audio signal recorded therein and for producing the reproduced digital audio signal in the form of a digital/analog converted signal, said first and second disc reproducing means being capable of operating independently of each other; and a common controller for controlling both said first and second disc reproducing means.

2. A system according to claim 1, further comprising a common digital bus linking said first and second disc reproducing means, said output means and said controller.

3. An on-board pictorial information source system for providing pictorial information for vehicle riders comprising:

disc reproducing means for producing from a disc recording medium digital data recorded therein;

output means for producing pictorial information on the basis of the reproduced digital data produced from said disc reproduction means;

selecting means for receiving the reproduced digital data from said disc reproducing means and selectively outputting said data at one of at least two outputs;

demodulating means connected to said one output for demodulating the digital data selectively produced at said output from said selecting means into an analog signal;

a controller connected to receive at least a portion of said data from said disc reproducing means for controlling said selecting means in accordance with the data recorded in a disc recording medium loaded in said disc reproducing means; and a common bus connecting at least said controller, said disc reproducing means and said output means.

4. A system according to claim 3, in which said disc reproducing means can accommodate a plurality of disc recording media.

5. An information presentation system comprising:

at least two disk reproducing means, each said reproducing means for reproducing digital data recorded on a disc recording medium mounted therein;

output means for displaying pictorial information from digital data reproduced from said at least one disk reproducing means;

switching means having input and output terminals and being connected to receive at said input terminals the digital data from at least two of said disk reproducing means for selecting an output of reproduced digital data of one of said disk reproducing means and providing it at a first switch output terminals;

demodulator means connected to receive the digital data from said first switch output terminal for demodulating into an analog signal the digital data of the output selected by said switching means;

a controller controlling said at least one disc reproducing means, said selecting means and said output means; and a common bus connecting at least said controller and at least one of said disc reproducing means.

6. A system as recited in claim 5, wherein said digital bus also is connected to said selecting means and said output means and is used for conveying said reproduced digital data from said at least one disc reproducing means to said output means.

7. A system as recited in claim 5, wherein said controller selects said output based on a digital signal stored in said disc recording medium mounted in said disc reproducing means associated with said selected output.

* * * * *